United States Patent
Meyers

(10) Patent No.: US 8,497,503 B2
(45) Date of Patent: Jul. 30, 2013

(54) MANUFACTURE OF PHOTOVOLTAIC DEVICES

(75) Inventor: Peter V. Meyers, Lakeside, MT (US)

(73) Assignee: First Solar, Inc., Perrysburg, OH (US)

(*) Notice: Subject to any disclaimer, the term of this patent is extended or adjusted under 35 U.S.C. 154(b) by 0 days.

(21) Appl. No.: 13/231,090

(22) Filed: Sep. 13, 2011

(65) Prior Publication Data

US 2012/0000532 A1    Jan. 5, 2012

Related U.S. Application Data

(62) Division of application No. 11/989,966, filed as application No. PCT/US2006/030146 on Aug. 3, 2006, now Pat. No. 8,030,121.

(60) Provisional application No. 60/705,544, filed on Aug. 5, 2005.

(51) Int. Cl.
*H01L 29/18* (2006.01)
*H01L 21/00* (2006.01)
*H01L 31/00* (2006.01)

(52) U.S. Cl.
USPC ........ 257/43; 257/461; 257/E31.016; 438/95; 136/262

(58) Field of Classification Search
USPC ........ 438/95; 257/43, 461, E31.016; 136/262
See application file for complete search history.

(56) References Cited

U.S. PATENT DOCUMENTS

| | | |
|---|---|---|
| 4,909,184 A | 3/1990 | Fujiyama |
| 5,480,494 A | 1/1996 | Inoue |
| 5,534,314 A * | 7/1996 | Wadley et al. ............... 427/585 |
| 6,534,704 B2 | 3/2003 | Hashimoto et al. |
| 6,660,538 B2 | 12/2003 | Delahoy |
| 7,449,629 B2 | 11/2008 | Ferri et al. |
| 2006/0005874 A1 | 1/2006 | Ferri et al. |
| 2007/0012353 A1 | 1/2007 | Fischer et al. |

OTHER PUBLICATIONS

John L. Vossen, Thin Film Porcesses II, Academic Press (1991), pp. 100-106, 444-453.
S. Kumar et al., Rapid Thermal Annealing of Cu-In/Se Stacked Layers, Semiconductor Sci. Technol. 1991, pp. 940-941.
Biltoft et al., Chapter 14: Thin Film Deposition Processes, Vacuum Technology 60A & 60B, Las Positas College (2002), pp. 171, 183 and 184, (accessed at http://1pc1.clpccd.cc.ca.us/1pc/tswain/chapt14.pdf).

* cited by examiner

*Primary Examiner* — David S Blum
(74) *Attorney, Agent, or Firm* — Dickstein Shapiro LLP

(57) ABSTRACT

A method and apparatus for depositing a film on a substrate includes subjecting material to an energy beam.

17 Claims, 4 Drawing Sheets

MANUFACTURE OF PHOTOVOLTAIC DEVICES

CROSS-REFERENCE TO RELATED APPLICATIONS

This application is a divisional of U.S. patent application Ser. No. 11/989,966, now U.S. Pat. No. 8,030,121, which was the U.S. national stage of International Application No. PCT/US2006/030146, filed Aug. 3, 2006, which claims priority to U.S. provisional patent application No. 60/705,544, filed Aug. 5, 2005, the subject matter of each of which is incorporated in its entirety by reference herein.

TECHNICAL FIELD

The invention relates to photovoltaic devices and the manufacture of photovoltaic devices.

BACKGROUND

In the manufacture of a photovoltaic device, semiconductor material is deposited on a substrate. This may be accomplished by subliming or sputtering the semiconductor and directing the vaporized semiconductor towards the glass substrate surface, such that the vaporized semiconductor condenses and is deposited on the substrate, forming a solid, thin semiconductor film, or layer.

SUMMARY

In general, a method and system for depositing a layer on a substrate at substantially atmospheric pressure is disclosed. The system and method can be used to manufacture a photovoltaic device including a semiconductor layer at substantially atmospheric pressure. For example, the system and method can be used to manufacture a photovoltaic device including a layer of copper indium diselenide at substantially atmospheric pressure.

In one aspect, a method for manufacturing a photovoltaic device includes exposing a starting material to an energy beam and forming a semiconductor layer on a surface of a substrate at substantially atmospheric pressure. The method can include depositing a transparent conducting layer onto the substrate. The method can include depositing a cadmium sulfide layer onto the transparent conducting layer. In certain embodiments, the method can include depositing at least one additional semiconductor layer onto the surface of the substrate.

In another aspect, a method for manufacturing a photovoltaic device includes exposing a starting material to an energy beam and forming a copper indium diselenide layer on a surface of a substrate at substantially atmospheric pressure. The method can include depositing a transparent conducting layer onto the substrate. The method can include depositing a cadmium sulfide layer onto the transparent conducting layer. In certain embodiments, the method can include depositing at least one additional semiconductor layer onto the surface of the substrate before forming the layer of copper indium diselenide.

In another aspect, a system for manufacturing a photovoltaic device includes a source material and an energy beam configured to vaporize the source material at substantially atmospheric pressure.

In another aspect, a photovoltaic device includes an energy beam deposited copper indium diselenide layer on a substrate in which the copper indium diselenide layer is deposited on the substrate at substantially atmospheric pressure.

The substrate can include glass. The energy beam can have a power of between 50 and 500 watts. The substrate can include a transparent conducting layer. The transparent conducting layer can include a zinc oxide, a tin oxide or an indium oxide. The source material can include copper indium gallium diselenide. The energy beam can be a radio frequency beam. The radio frequency beam can include microwave radiation.

The details of one or more embodiments are set forth in the accompanying drawings and the description below. Other features, objects, and advantages will be apparent from the description and drawings, and from the claims.

DETAILED DESCRIPTION

A system and method can be used to manufacture a semiconductor layer at substantially atmospheric pressure on a substrate. A semiconductor can include for example, a binary or ternary semiconductor material. A semiconductor can include a Group II-VI compound, a Group II-V compound, a Group compound, a Group III-V compound, a Group IV-VI compound, a Group compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

For example, the system and method can be used to manufacture copper indium diselenide at substantially atmospheric pressure on a substrate. The copper indium diselenide can be a doped copper indium diselenide or other copper indium diselenide, or alloyed copper indium diselenide, such as, for example, copper indium gallium diselenide. Other elements alloyed with copper indium diselenide can include sulfur or aluminum, for example, $CuInS_2$, $CuIn(S, Se)_2$, $Cu(In,Al)Se_2$, or others. The substrate can be a glass substrate or another suitable substrate such as polymer substrate having a surface suitable for forming a uniform film, such as a polyimide, or a metal substrate, such as a foil. The copper indium diselenide can form a layer on the substrate. The copper indium diselenide is deposited at substantially atmospheric pressure by exposing a source material to an energy beam. The source material can be copper indium diselenide, copper indium gallium diselenide, a mixture of oxides including one or more of indium oxide, gallium oxide or copper oxide, a mixture of selenides including one or more of indium selenide, gallium selenide or copper selenide, or a mixture of a metal oxide, a metal sulfide, or a metal selenide. The source can be a solid or powder.

Figure 1:
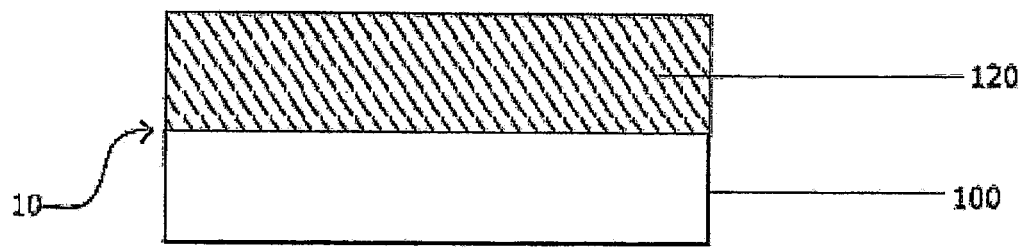
FIG. 1 is a drawing depicting a method for depositing a copper indium diselenide layer onto a substrate at substantially atmospheric pressure.

Referring to FIG. 1, a copper indium diselenide layer 120 is formed on a substrate 100 at substantially atmospheric pressure. The copper indium diselenide layer 120 can be a copper indium gallium diselenide (CIGS) layer, or a precursor layer capable of being converted to a CIGS layer, such as an oxide layer. In certain embodiments, substrate 100 can be a glass or a metal. Substrate 100 can include additional layers of material, including, for example, a transparent conductive oxide layer, such as a zinc oxide, a tin oxide or an indium oxide, or a semiconductor layer, such as cadmium sulfide. Copper indium gallium diselenide layers can be used to form a photovoltaic device. See, for example, "*Nanoparticle Oxides Precursor Inks for Thin Film Copper Indium Gallium Selenide* (*Copper Indium Gallium Diselenide*) *Solar Cells*," Kapur, Vijay K. et al., Mat. Res. Soc. Proc. Vol. 668, (2001) pp H2.6.1-H2.6.7, which is incorporated by reference in its entirety.

The copper indium diselenide formed at substantially atmospheric pressure with an energy beam on a substrate can be part of a photovoltaic device. Advantageously, the method and system for manufacture copper indium diselenide with an energy beam at substantially atmospheric pressure produces a photovoltaic device that is more efficient, less expensive to manufacture and more stable than other semiconductor-based photovoltaic devices. By allowing production at substantially atmospheric temperatures and localizing the heat produced, an energy beam can allow for higher efficiency photovoltaic devices to be prepare by less expensive manufacturing methods. The formation of the copper indium diselenide layer using an energy beam at substantially atmospheric pressure can allow the manufacture of the layer to occur more efficiently than reduced pressure processes. The layer can be formed at substantially atmospheric pressure, for example, between 0.5 and 1.5 atmospheres, between 0.8 and 1.2 atmospheres, or between 0.9 and 1.1 atmospheres.

Figure 2:
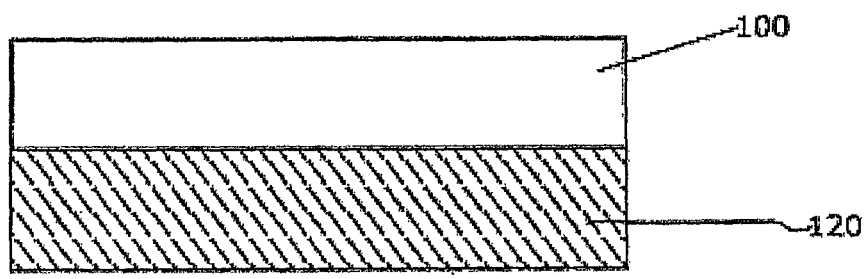
FIG. 2 is a drawing depicting a system for depositing a semiconductor on a glass sheet substrate.
Figure 2:
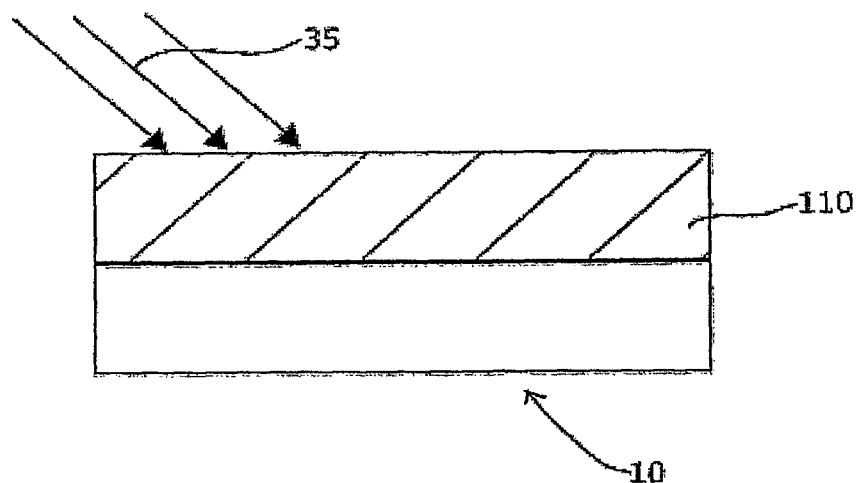

Referring to FIG. 2, source material 110 is exposed to an energy beam 35. At substantially atmospheric temperature, exposure of the source material 110 to the energy beam 35 causes the copper indium diselenide material to form layer 120 on substrate 100.

The energy beam is a radio frequency beam, electron beam, microwave beam or x-ray beam directed from a source, having a power of between 1 and 1000 watts, or 10 and 500 watts. The energy beam can enable formation of copper indium diselenide with heat confined very close to the growing surface and can greatly improving material utilization rate during growth and selenization. Localized heating also can allow use of lower temperature substrates, possibly enabling fabrication of devices in the superstrate configuration. Also, the energy beam can enable processing at atmospheric pressure, enabling use of lower cost equipment.

The copper indium diselenide formed at substantially atmospheric pressure with an energy beam on a substrate can be formed as a metal, an oxide, or a sulfide precursor that is subsequently selenized, during which the chemical and electrical properties of the compound are developed. Typically, the selenization process occurs in a low pressure system and at about 500° C. In some cases the selenization employs elemental selenium; in other cases hydrogen selenide is employed. In either case selenization is a low materials utilization process. Also, because selenium at high temperatures reacts with most metals, all CIGS devices are deposited onto relatively non-reactive molybdenum substrates. By using an energy beam at substantially atmospheric pressure to directly deposit the copper indium diselenide on a substrate, the selenization step can be avoided, and device architectures utilizing substrates other than molybdenum can be manufactured.

The molybdenum substrate forms a low resistance contact to the copper indium diselenide, which means that copper indium diselenide-based devices prepared by methods other than energy beam deposition must be fabricated in the substrate configuration. In order to take advantage of its relatively low bandgap (~1.2 eV), copper indium gallium diselenide devices typically use zinc oxide as the transparent conductive oxide layer. Zinc oxide can degrade rapidly when exposed to water vapor, but use of the substrate configuration limits suitable encapsulants to those that have high optical and near infrared transmission. Formation of the copper indium diselenide at substantially atmospheric pressure using an energy beam can permit device structures having a superstate configuration to be manufactured, and allows other encapsulants with superior vapor barrier properties, such as ethylene propylene diene copolymer (EPDM), polyisobutylene (KB) or other rubber materials to be used in the devices.

Figure 3:
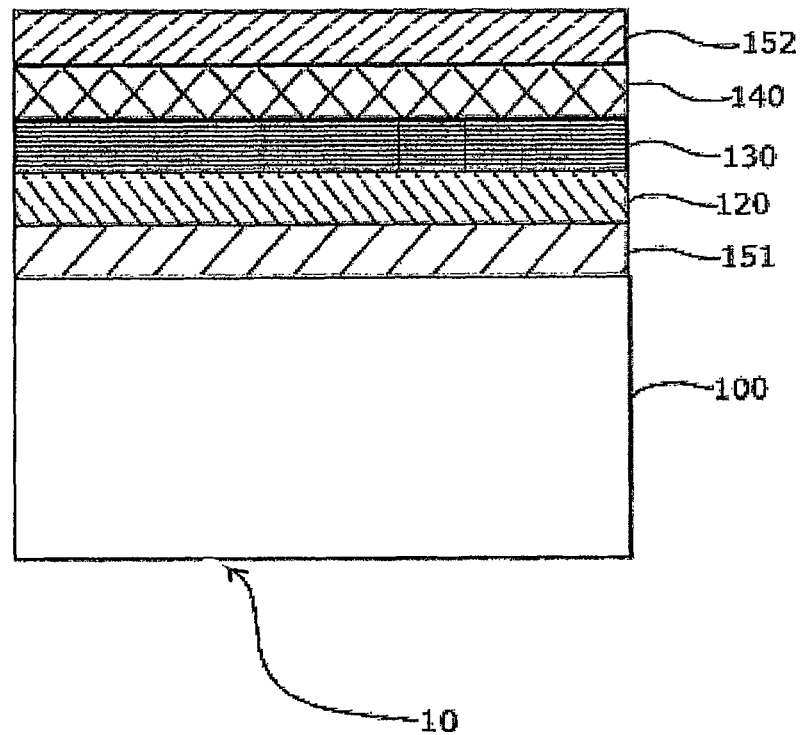
FIG. 3 is a drawing depicting a copper indium diselenide based photovoltaic device.

Referring to FIG. 3, a photovoltaic device 10 includes a substrate 100, lower conductive layer 151, an indium gallium diselenide layer 120, an n-type layer 130, transparent conductive oxide layer 140, and upper layer 152. The transparent conductive oxide layer 140 can be a zinc oxide layer. The n-type layer 130 can be cadmium sulfide or any other n-type material capable of forming a p-n junction with the copper indium diselenide layer. Upper layer 152 can be a transparent protective material such as, for example, a glass, such as borosilicate or soda lime glass. Devices based on indium gallium sulfide-cadmium sulfide structures greatly reduce the cadmium-content of the photovoltaic device; in fact Cd-free versions of CIGS cells have been demonstrated. Devices with this structure can have demonstrated stability over many years.

Figure 4:
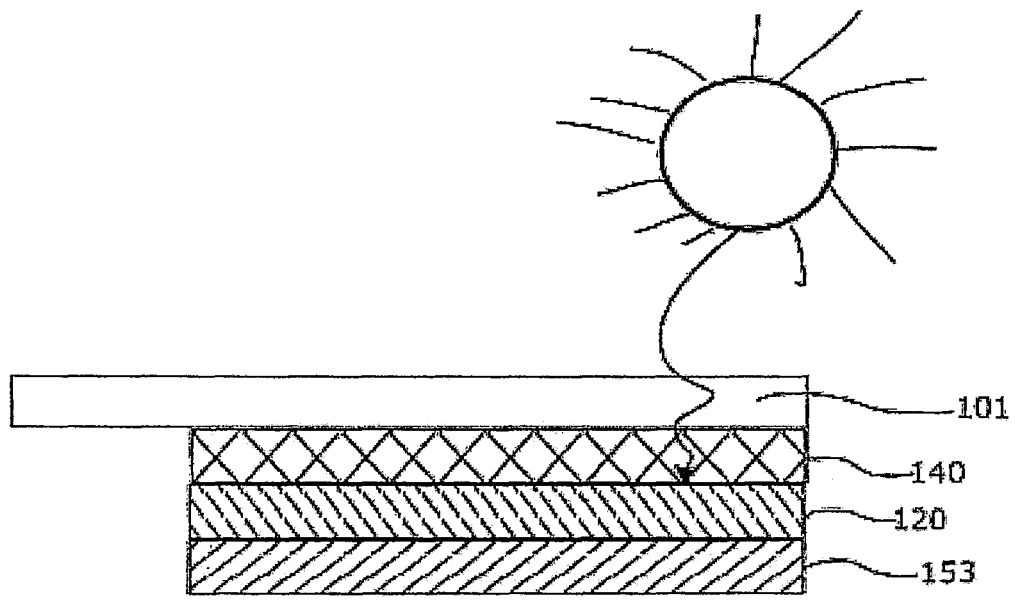
FIG. 4 is a drawing depicting a copper indium diselenide based photovoltaic device in a superstrate configuration.

Referring to FIG. 4, a photovoltaic device in a superstrate configuration includes a glass substrate 101 oriented so that sunlight passes through the glass substrate layer 101 to the semiconducting layers. The glass substrate can be coated by a transparent conductive oxide. Sunlight passes through the transparent oxide layer 140 to the semiconductor layer 120. In the superstrate structure, the semiconductive layer 120 is a copper indium diselenide and sits on a back conductive layer 153.

The embodiments described above are offered by way of illustration and example. It should be understood that the examples provided above may be altered in certain respects and still remain within the scope of the claims. For example, the copper indium diselenide layer can be doped or alloyed with a variety of materials to alter its chemical and physical properties, particularly its optical and electronic properties. It should be appreciated that, while the invention has been described with reference to the above preferred embodiments, other embodiments are within the scope of the claims.

What is claimed is:

1. A photovoltaic device comprising:
   a glass superstrate having a first surface for receiving solar radiation;
   an energy beam deposited copper indium diselenide layer opposite the first surface of the superstrate glass, and
   an encapsulant comprising at least one of ethylene propylene diene copolymer, polyisobutylene and a rubber material,
   wherein the copper indium diselenide layer is deposited opposite the first surface of the superstrate glass at substantially atmospheric pressure.

2. The photovoltaic device of claim 1, further comprising a transparent conducting layer on the superstrate glass.

3. The photovoltaic device of claim 1, wherein the copper indium diselenide includes copper indium gallium diselenide.

4. The photovoltaic device of claim 1, wherein the copper indium diselenide includes copper indium gallium diselenide.

5. The photovoltaic device of claim 1, wherein the energy beam is a radio frequency beam.

6. The photovoltaic device of claim 5, wherein the radio frequency beam includes microwave radiation.

7. A method for manufacturing a photovoltaic device comprising:
   providing a glass superstrate having a first surface for receiving solar radiation;
   exposing a starting material to an energy beam at substantially atmospheric pressure, thereby causing the starting material to vaporize;
   forming a semiconductor layer of the vaporized starting material opposite the first surface of a superstrate glass; and
   forming an encapsulant at least partially encapsulating the device, the encapsulant comprising at least one of ethylene propylene diene copolymer, polyisobutylene and a rubber material.

8. The method of claim 7, wherein the energy beam has a power of between 50 and 500 watts.

9. The method of claim 7, further comprising depositing a transparent conducting layer onto the superstrate glass.

10. The method of claim 9, wherein the transparent conducting layer includes a zinc oxide, a tin oxide or an indium oxide.

11. The method of claim 9, further comprising depositing a cadmium sulfide layer onto the transparent conducting layer.

12. The method of claim 9, further comprising depositing at least one additional semiconductor layer opposite the surface receiving solar radiation of the superstrate glass.

13. The method of claim 7, wherein the energy beam is a radio frequency beam.

14. The method of claim 13, wherein the radio frequency beam includes microwave radiation.

15. The method of claim 7, wherein the method occurs at a pressure between about 0.5 atmospheres and about 1.5 atmospheres.

16. The method of claim 7, wherein the method occurs at a pressure between about 0.8 atmospheres and about 1.2 atmospheres.

17. The method of claim 7, wherein the method occurs at a pressure between about 0.9 atmospheres and about 1.1 atmospheres.

\* \* \* \* \*